(12) United States Patent
Okada et al.

(10) Patent No.: US 6,593,523 B2
(45) Date of Patent: Jul. 15, 2003

(54) SHIELD STRUCTURE FOR ELECTRONIC CIRCUIT PARTS

(75) Inventors: Masaaki Okada, Chiyoda-ku (JP); Hitoshi Matsudaira, Miyoshi (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 78 days.

(21) Appl. No.: 09/883,946

(22) Filed: Jun. 20, 2001

(65) Prior Publication Data

US 2002/0096344 A1 Jul. 25, 2002

(30) Foreign Application Priority Data

Jan. 19, 2001 (JP) ........................................ 2001-012146

(51) Int. Cl.[7] ................................................ H05K 9/00
(52) U.S. Cl. ..................... 174/35 R; 361/752; 361/753; 361/818
(58) Field of Search ........................... 174/35 R, 35 GC; 361/816, 818, 748, 752, 753, 730, 796, 799, 800, 802

(56) References Cited

U.S. PATENT DOCUMENTS

| 4,370,515 A | * | 1/1983 | Donaldson | ................ 174/35 R |
| 5,508,889 A | | 4/1996 | Ii | |
| 5,537,123 A | * | 7/1996 | Mandai et al. | ........ 343/700 MS |
| 5,559,676 A | * | 9/1996 | Gessaman | .................... 361/752 |
| 5,907,478 A | | 5/1999 | Watanabe | |

FOREIGN PATENT DOCUMENTS

| EP | 0 963 148 | 12/1999 |
| JP | 7-240591 | 9/1995 |
| JP | 9-27691 | 1/1997 |

* cited by examiner

Primary Examiner—Dean A. Reichard
Assistant Examiner—Carmelo Oliva
(74) Attorney, Agent, or Firm—Oblon, Spivak, McClelland, Maier & Neustadt, P.C.

(57) ABSTRACT

The invention provides a shield structure that allows an easy installment of a shield case on a circuit board with more strength and firmness even if the shield case is warped or distorted. The proposed shield case includes a frame member consisting of four sidewalls and a cover member covering a farther end of the frame member from the circuit board. The frame member comprises a supporting member for sustaining the frame member on the circuit board and end faces confronting the circuit board. The supporting member comprises three projections protruding from the end face toward the circuit board.

8 Claims, 4 Drawing Sheets

PRIOR ART

PRIOR ART

SHIELD STRUCTURE FOR ELECTRONIC CIRCUIT PARTS

BACKGROUND OF THE INVENTION

1. Technical Field

The present invention relates to a shield structure for electronic circuit parts for shielding electronic circuit parts disposed on a circuit board.

2. Background Art

Electronic circuit parts, such as those used in cellular phones, are disposed or packaged on a circuit board. Specific electronic parts among the mentioned electronic circuit parts, for example electronic parts for handling high frequency wave, are covered with a shield case made of a conductive body, and are shielded electrically and magnetically.

FIG. 6 shows a conventional shield structure for electronic circuit parts. Referring to FIG. 6, a plurality of electronic circuit parts are disposed or packaged on a circuit board 1, and a shield case 2 is installed on the circuit board 1 to cover specific electronic circuit parts. The shield case 2 is of a rectangular solid box shape with an open end, and is fixed by soldering on the circuit board 1 with the open end facing the circuit board, so as to enclose specific circuit parts. This shield case 2 of rectangular solid box shape is placed so that each end face of the four sidewalls contact the circuit board 1, i.e., so that the shield case 2 contacts the circuit board 1 at four end faces thereof, and each end face and the circuit board 1 are soldered with a solder 3. Additionally, reference numeral 3a indicates a faulty soldered part.

FIG. 7 is a shield structure for electronic circuit parts disclosed in the Japanese Laid-open Patent Application No. 27691/1997. The open-end faces of the shield case 2 are provided with four fixing hooks 4 projecting in L-shape. The circuit board 1 is provided with rectangular holes 5 corresponding to the four fixing hooks 4, and metallic pads 6 each adjacent to each of the rectangular holes 5. Each of the four fixing hooks 4 of the shield case 2 is inserted through each rectangular hole 5, and folded so as to be in contact with the metallic pad 6, and then fixed to the circuit board 1 by soldering. In this structure, the shield case 2 is installed on the circuit board 1 sustained at four points.

As described above, the shield cases has been conventionally installed on the circuit board either by soldering the four faces as shown in FIG. 6, or by soldering the four sustaining points as shown in FIG. 7. However, the sidewalls of a shield case of rectangular solid box shape may be warped or distorted because the shield cases are generally molded by bending or pressing process. If any of the sidewalls of the shield case is warped or distorted in case of the four-face contact as shown in FIG. 6 and the contact faces do not constitute a plane surface, the four faces will not fully contact the circuit board, and consequently sufficient attaching strength cannot be secured by soldering, which may eventually result in an accident that the shield case gets out of and falls from the circuit board.

Moreover, in the four-point sustention structure as shown in FIG. 7, if the shield case is warped or distorted, it may be impossible to insert the four fixing hooks 4 through the corresponding four rectangular holes 5, or to fold any of the fixing hooks 4 though the insertion is barely achieved. Consequently, the shield case cannot be installed on the circuit board.

It is certain that such disadvantage caused by warp or distortion of a shield case can be solved by reworking each contact face of the shield case to improve the flatness precision of the four contact faces in case of four-face contact as in FIG. 6, or by eliminating the warp or distortion through a heat treatment of the shield case in case of four-point sustention structure as in FIG. 7. But, the aforementioned reworking or heat treatment requires extra operations, which will result in a disadvantage of cost increase.

SUMMARY OF THE INVENTION

In view of the foregoing disadvantages incidental to the prior arts, and object of the present invention is to propose an improved shield structure for electronic circuit parts, which allows an easy installation of a shield case on a circuit board with more strength and firmness, even if the shield case is warped or distorted.

To accomplish the foregoing object, a shield structure for electronic circuit parts according to the present invention comprises a circuit board on which a plurality of electronic circuit parts are disposed and a shield case which is installed on said circuit board to enclose and shield specific electronic circuit parts among said plurality of electronic circuit parts; wherein said shield case comprises a frame member including four sidewalls and a cover member covering the farther end of the frame member from said circuit board; said frame member includes a supporting member for sustaining said frame member on said circuit board and an end face confronting the mentioned circuit board; and said supporting member is composed of three projections protruding from the said end face toward the mentioned circuit board.

As a result of such an arrangement, the shield case can be securely joined to the circuit board by three-point sustention, and fixed securely and firmly at the joints, without any additional subsequent treatment such as reworking or heat treatment.

It is preferable that, in the shield structure for electronic circuit parts according to the invention, said circuit board is provided with a circuit pattern formed thereon and a solder bed formed on said circuit pattern, and each of said projections is soldered to said circuit pattern penetrating through the solder bed, and gap is formed at least one part between said end face and the circuit pattern, and said gap is not larger than 0.1 millimeter.

As a result, the above described shield structure can secure a sufficient shielding effect, while absorbing the warp or distortion of a shield case as a variation in the gap.

It is also preferable that, in the shield structure for electronic circuit parts according to the present invention, said circuit board is provided with a circuit pattern formed thereon and a solder bed formed on said circuit pattern, and each said projections is soldered to said circuit pattern penetrating through the solder bed, and gap is formed at least one part between said end face and the circuit pattern, and a solder is inserted in at least one part of said gap.

As a result, the above described shield structure can secure a more firm shielding effect, while absorbing the warp or distortion of a shield case as a variation in the gap dimension.

It is also preferable that, in the shield structure for electronic circuit parts according to the invention, the first sidewall of said four sidewalls is provided with the first and the second projections of said three projections, and the second sidewall of said four sidewalls confronting said first sidewall is provided with the third projection of said three projections.

As a result, the three-point sustention structure can be stabilized all the more.

It is also preferable that, in the shield structure for electronic circuit parts according to the invention, said first, second and third projections are placed so as to fall on each vertex of an isosceles triangle.

As a result, the three-point sustention structure can be stabilized all the more.

It is also preferable that, in the shield structure for electronic circuit parts according to the invention, said first sidewall is provided with an extension extending across the mentioned circuit board in the direction of thickness thereof, and said first and second projections are placed on both sides of said extension.

As a result, the positioning and close joint of the first sidewall and the circuit board can be achieved by means of the mentioned extension.

It is also preferable that, in the shield structure for electronic circuit parts according to the invention, said second sidewall is provided with two extensions extending across said circuit board in the direction of thickness thereof, and said third projection is placed between each of these extensions.

As a result, the positioning and close joint of the second sidewall and the circuit board can be achieved by means of the mentioned extensions.

Further, a shield structure for electronic circuit parts according to the invention comprises a circuit board on which a plurality of electronic circuit parts are disposed, and a shield case which is installed on said circuit board to enclose and shield specific electronic circuit parts among said plurality of electronic circuit parts; wherein said shield case is provided with a frame member including first and second sidewalls confronting each other, third and fourth sidewalls confronting each other and a cover member covering the farther end of the frame member from said circuit board; said first sidewall is provided with an extension extending across said circuit board in the direction of thickness thereof and two projections placed on both sides of the extension; said second sidewall is provided with two extensions extending across said circuit board in the direction of thickness thereof and a projection placed between said two extensions; and said third and fourth sidewalls are provided with end faces confronting said circuit board, each of said projections protruding to said circuit board for supporting said shield case.

As a result of such arrangement, the positioning and close joint of the first and the second sidewalls and the circuit board can be achieved by means of the mentioned extensions.

DESCRIPTION OF THE PREFERRED EMBODIMENTS

Embodiment 1

Figure 1:
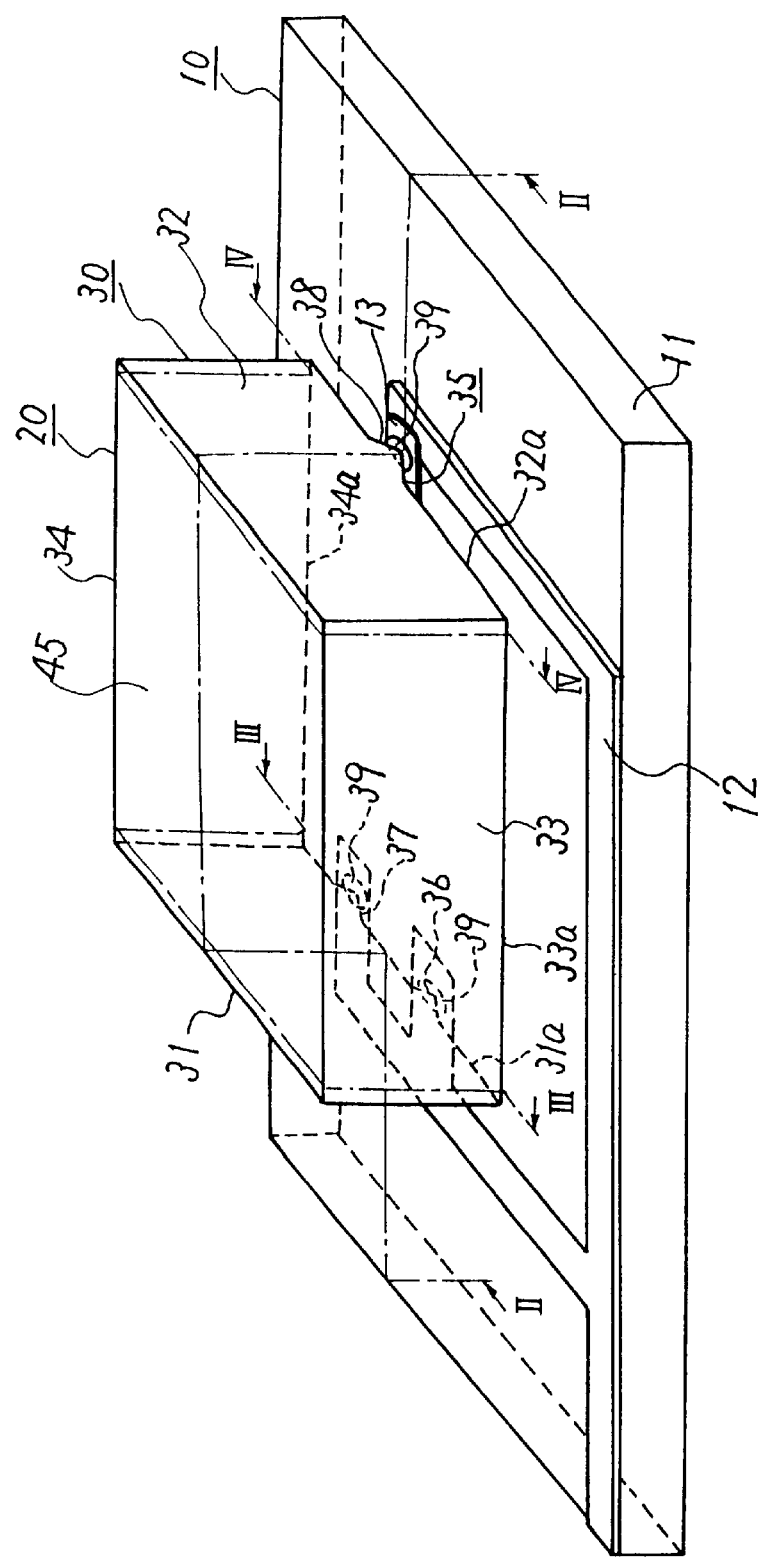
FIG. 1 is a perspective view showing Embodiment 1 of a shield structure for electronic circuit parts according to the present invention.

FIG. 1 is a perspective view showing Embodiment 1 of a shield structure for electronic circuit parts according to the present invention. The shield structure according to the embodiment 1, which is incorporated for example in cellular phones, comprises a circuit board 10 disposing or packaging a large number of electronic circuit parts (not shown) and a shield case 20 shielding specific electronic circuit parts among the large number of electronic circuit parts. In cellular phones, a large number of electronic circuit parts such as transmitting and receiving circuits, driving circuit for liquid crystal display and control circuits thereof are employed, and those electronic circuit parts are disposed or packaged on the circuit board 10. Such electronic circuit parts include a plurality of electronic circuit parts for treating high frequency wave, which are distinguished as specific electronic circuit parts and are shielded electrically and magnetically by the shield case 20.

The circuit board 10 is formed with a copper layer on the main surface of upper or lower, or both faces of an insulating substrate 11 made of insulating material, and a circuit pattern 12 formed by patterning the copper layer according to a prescribed pattern. A large number of electronic circuit parts such as semiconductor integrated circuit elements, resistive elements, capacitative elements, inductive elements are disposed or packaged and soldered to the circuit pattern at predetermined positions on the circuit pattern 12. FIG. 1 only shows the pattern 12 for connecting the shield case 20 to a reference potential point, i.e., earth potential, but practically a large number of other circuit patterns 12 are placed. The circuit pattern 12 on the circuit board 10 is provided with a solder bed 13 for soldering electronic circuit parts on predetermined positions, and this solder bed 13 is used for soldering.

The shield case 20 is molded into a rectangular solid box shape by bending sheet metal made of conductive material such as copper or copper pyrites. The shield case 20 has a rectangular-shaped frame member 30 and a cover member 45, and the mentioned frame member 30 and cover member 45 are molded integrally in one body. The frame member 30 comprises four sidewalls 31, 32, 33 and 34, among which the first sidewall 31 and the second sidewall 32, also the third sidewall 33 and the fourth sidewall 34 are respectively confronting each other in parallel. The frame member 30 is sustained and mounted on the circuit board 10 in such a manner that each of the sidewalls 31, 32, 33 and 34 makes perpendicular to the main surface of the circuit board 10.

The end on one side of the frame member 30, i.e., the farther end from the circuit board 10 is covered with the cover member 45, while the other end of the frame member 30, i.e., the end closer to the circuit board 10 is an open end. Since the end of the frame member 30 closer to the circuit board 10 is open, specific electronic circuit parts among a large number of electronic circuit parts can enter into the shield case 20 through the mentioned open end, and can be enclosed or surrounded and shielded by the shield case 20.

At the end of the frame member closer to the circuit board 10, the end faces 31a, 32a, 33a and 34a of the sidewalls 31, 32, 33 and 34 are respectively confronting the main surface of the circuit board 10. These end faces 31a, 32a, 33a and 34a are approximately parallel to the main surface of the circuit board 10, and confronting the circuit pattern 12 on the main surface of the circuit board 10 with a minimal gap g in between.

The end faces 31a of the first sidewall 31 and 32a of the second sidewall 32 are respectively provided with a supporting member 35 for sustaining the shield case 20 on the circuit board 10. This supporting member 35 is composed of three projections 36, 37 and 38, by which the supporting member 35 sustains the shield case 20 at three points on the circuit board 10. Two projections 36 and 37, and the remaining projection 38 of the three projections are respectively protruding from the end face 31a of the first sidewall 31 and from the end face 32a of the second sidewall 32, by a prescribed height p (see FIGS. 3 and 4) upon the end face 31a and the end face 32a.

The three projections 36, 37 and 38 are located at three vertexes of a triangle. The projection 38 is located at the middle of the projections 36 and 37 when viewed to the direction confronting the sidewalls 31 and 32, therefore the mentioned triangle is an isosceles triangle with the side between the projections 36 and 37 as base and with the projection 38 as peak. This isosceles triangle stabilizes the three-point sustention structure of the supporting member 35 all the more.

Figure 2:
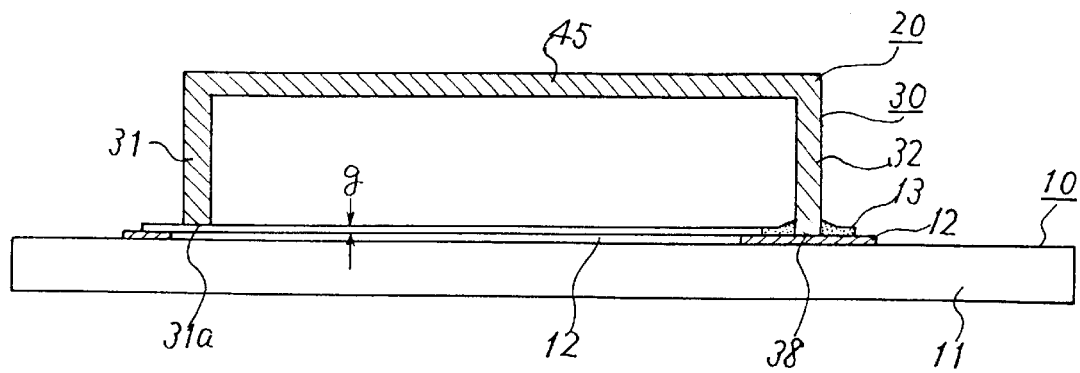
FIG. 2 is a sectional view taken along the line II—II of FIG. 1.
Figure 3:
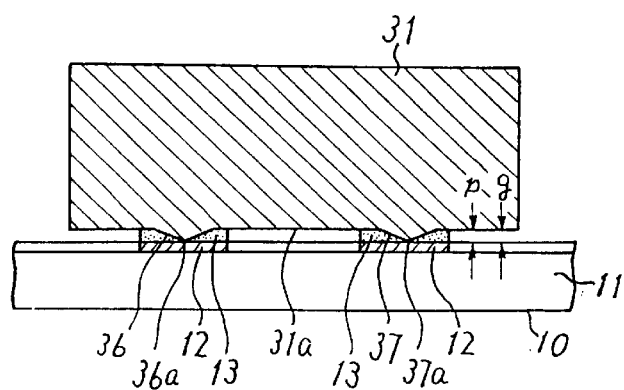
FIG. 3 is a sectional view taken along the line III—III of FIG. 1.
Figure 4:
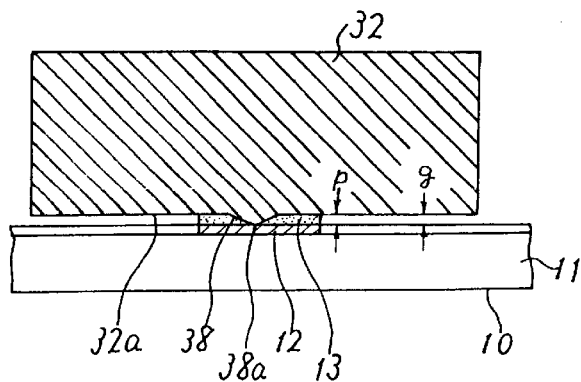
FIG. 4 is a sectional view taken along the line IV—IV of FIG. 1.

FIGS. 2, 3 and 4 specifically show more clearly the structure of the supporting member 35 in the shield structure shown in FIG. 1. FIG. 2 is a sectional view taken along the line II—II of FIG. 1 and viewed to the arrow direction, FIG. 3 is a sectional view taken along the line III—III of FIG. 1 which vertically cuts the sidewall 31, and FIG. 4 is a sectional view taken along the line IV—IV of FIG. 1 which vertically cuts the sidewall 32.

Referring to FIGS. 2, 3 and 4, the end faces 31a, 32a, 33a and 34a of the respective sidewalls 31, 32, 33 and 34 are parallel to the main surface of the circuit board 10, and confronting the upper face of the circuit pattern 12 with a prescribed gap g in between. The projections 36, 37 and 38 are protruding substantially forming a triangle shape from the end faces 31a and 32a, and each of the protruding vertexes 36a, 37a and 38a is joined to the upper face of the circuit pattern 12 penetrating through the solder bed 13. The solder bed 13 solidifies after once melting by heat treatment, to solder each electronic circuit part and each of the projections 36, 37 and 38 on the circuit pattern 12. Each of the projections 36, 37 and 38 is soldered close to the protruding vertex 36a, 37a and 38a joined to the circuit pattern 12. Number 39 in FIG. 1 shows soldered sections of each of the projections 36, 37 and 38.

More specifically, in actual product, thickness of the solder bed 13 is for instance 0.1 millimeter (mm), gap g is 0.1 to 0.2 mm, and the protruding height p of the projections 36, 37 and 38 is 0.1 to 0.2 mm. Thickness of each sidewall 31, 32, 33 and 34 is 0.1 to 0.3 mm.

In this Embodiment 1, it is important that the supporting member 35 is composed of three projections 36, 37 and 38 for sustaining the shield case 20 at three points. As compared with the conventional four-face contact or four-point sustention, the projections 36, 37 and 38 provide a more secure contact and sustention. Each of the projections 36, 37 and 38 can be securely joined to the upper face of the circuit pattern 12, even if the shield case 20 is warped or distorted. This is because the only effect of such warp or distortion is variation in dimension of the gap g as long as the extent of the warp or distortion is within the gap g, and consequently all the three projections 36, 37 and 38 are securely and firmly soldered at the respective joints.

The three projections 36, 37 and 38 placed on the sidewalls 31 and 32 confronting each other make the three-point sustention more stable, and placing these three projections 36, 37 and 38 so as to form an isosceles triangle further stabilizes the three-point sustention.

As to the minimal gap g formed between the respective end faces 31a, 32a, 33a and 34a of the sidewalls 31, 32, 33 and 34, and the upper face of the circuit pattern 12, substantial leakage was not confirmed through an experiment with the mentioned product. Also, soldering each of the end faces 31a, 32a, 33a and 34a with the circuit pattern 12 or with the upper face of the substrate 11 so that the solder enters into the gap g is useful to obtain a more assured shielding effect by the shield case 20.

Embodiment 2

Figure 5:
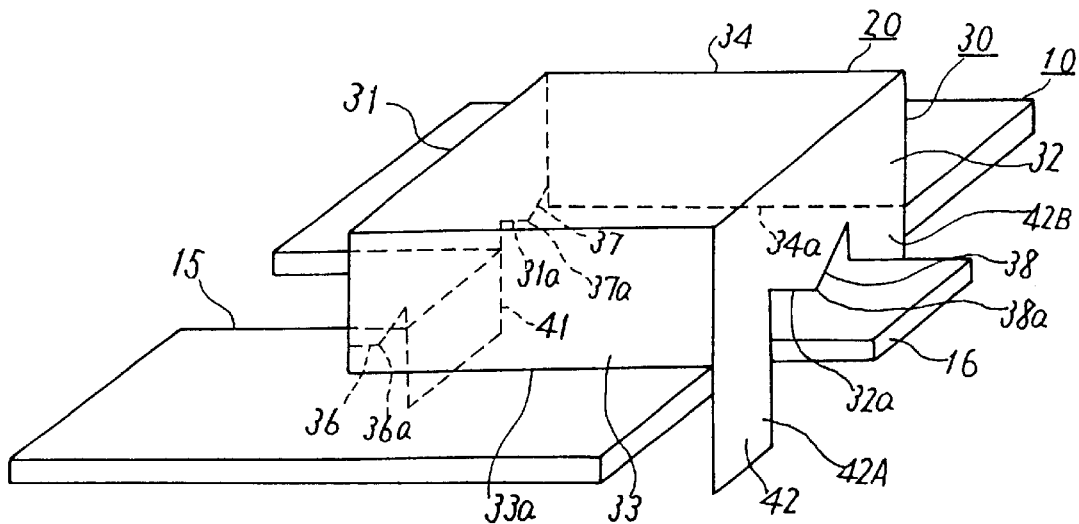
FIG. 5 is a perspective view showing Embodiment 2 of a shield structure for electronic circuit parts according to the invention.
Figure 6:
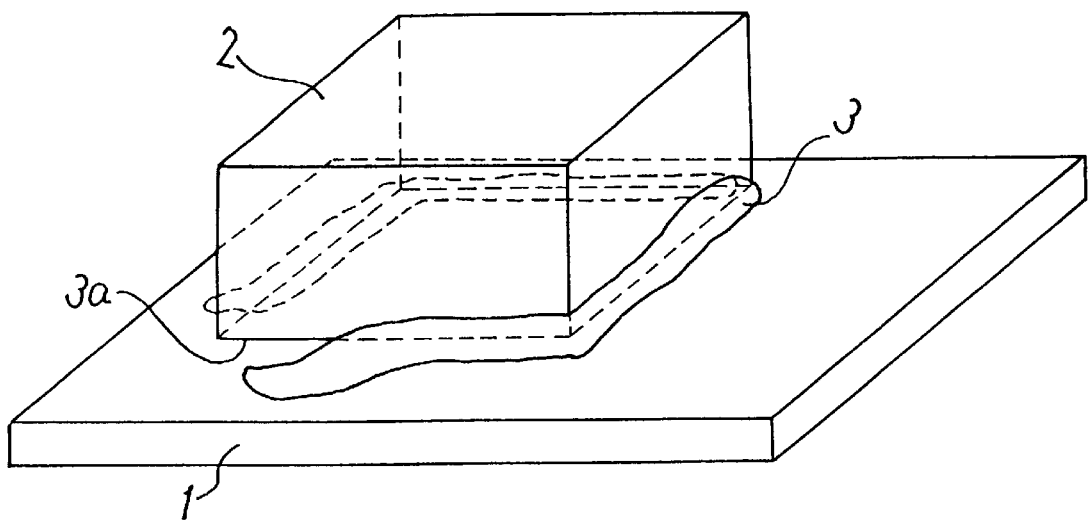
FIG. 6 is a perspective view showing a conventional structure.
Figure 7:
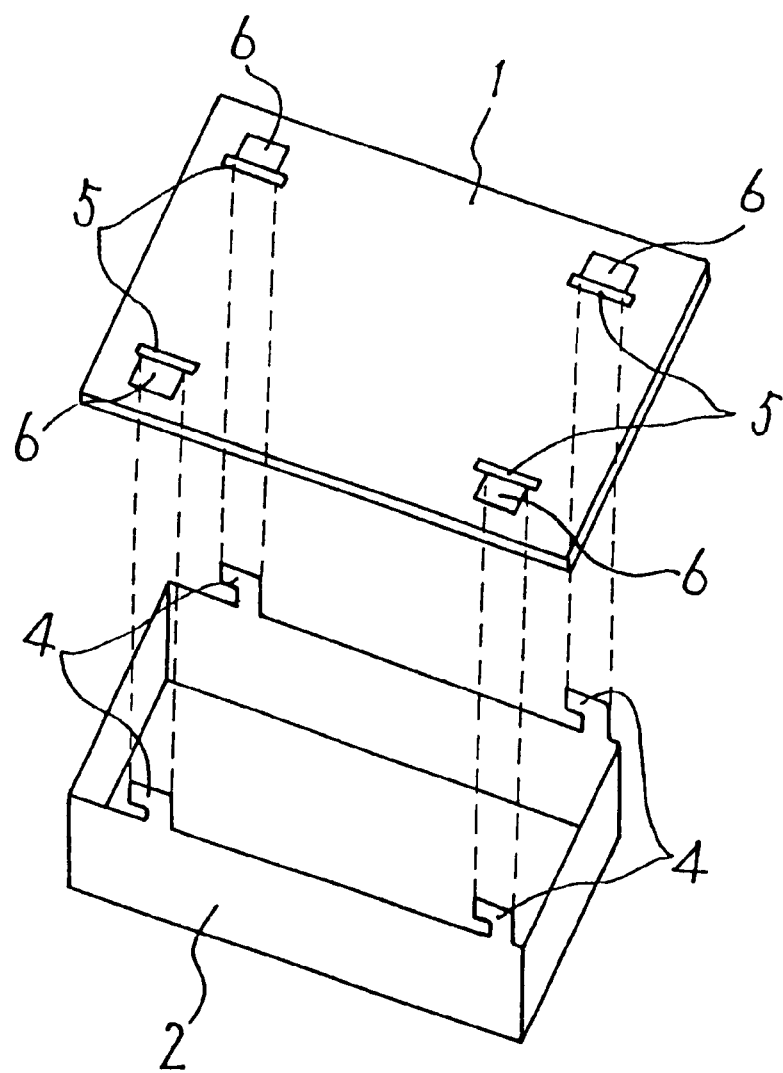
FIG. 7 is a perspective view showing another conventional structure.

FIG. 5 is a perspective view showing an embodiment 2 of a shield structure for electronic circuit parts according to the invention. In this Embodiment 2, the first sidewall 31 and the second sidewall 32 of the frame member 30 are respectively provided with extensions 41 and 42, corresponding to which the ends of the circuit board 10 are respectively provided with a slit 15 and a protruding part 16.

Firstly the extension 41 extends downward from the end of the first sidewall 31 on the circuit board 10 side, across the circuit board 10 and the direction of thickness thereof. On both sides of this extension 41, the first projection 36 and the second projection 37 are formed in the same manner as in the foregoing Embodiment 1. The extension 41 is crossing with the circuit board 10 at the slit 15 formed on one end of the circuit board 10, and the inner face of the extension 41 is parallel to the end face at the recess of the slit 15, and entirely joined to the mentioned end face. As a result of such structure, the positioning of the first sidewall 31 for the circuit board 10, and a close joint with the circuit board 10 can be achieved.

The extension 42 is a continuous section extending from the end of the second sidewall 32 on the circuit board 10 side, the second sidewall 32 confronting the first sidewall 31. The extension 42 consists of two extension parts 42A and 42B, and at the middle of these two extension parts, the third projection 38 is formed in the same manner as in the foregoing Embodiment 1. The extension parts 42A and 42B are holding therebetween the bulge 16 formed on the circuit board 10, and extend downward across the circuit board 10. The inner faces of the extensions 42A and 42B are parallel to the end face of the circuit board 10 on both sides of the bulge 16, and entirely joined to the mentioned end face. As a result of such structure, the positioning of the second sidewall 32 for the circuit board 10, and a close joint with the circuit board 10 can be achieved.

Though circuit patterns on the circuit board 10 are omitted in FIG. 5, practically a large number of circuit patterns are formed on the circuit board 10 12 in the same manner as in the embodiment 1, and the first, second and third projections 36, 37 and 38 are joined to a circuit pattern connected to the reference potential point, i.e., the earth potential. As a result, a secure support by three-point sustention for the shield case 20, as well as a secure and firm fixation by the solder bed 13 can be achieved, thereby the same advantage as that in the foregoing Embodiment 1 being achieved.

In addition, in this embodiment 2, it is also preferred that the three projections 36, 37 and 38 be placed so as to fall on each vertex of an isosceles triangle as in the foregoing Embodiment 1. Such a configuration is advantageous to better stabilize the three-point sustention structure as in the foregoing Embodiment 1.

Embodiment 3

It is also preferable to adopt a further embodiment in combination of the foregoing Embodiments 1 and 2. Firstly, in Embodiment 1, it is possible to modify the arrangement of only the first sidewall 31 to that described in Embodiment 2, and add the extension 41 thereto. In this case, the circuit board 10 should be provided with a slit 15 as shown in FIG. 5. Secondly, in Embodiment 1, it is also possible to modify the arrangement of only the second sidewall 32 to that described in Embodiment 2, and add two extensions 42A and 42B thereto. In this case, the circuit board 10 is provided with the protruding part 16 as shown in FIG. 5.

What is claimed is:

1. A shield structure for electronic circuit parts comprises a circuit board on which a plurality of electronic circuit parts are disposed and a shield case which is installed on said circuit board to enclose and shield specific electronic circuit parts among said plurality of electronic circuit parts;

wherein said shield case comprises a frame member including four sidewalls and a cover member covering the farther end of the frame member from said circuit board; said frame member includes a supporting member for sustaining said frame member on said circuit board and an end face confronting said circuit board; and said supporting member consists of three projections protruding from said end face toward said circuit board.

2. The shield structure for electronic circuit parts according to claim 1, wherein said circuit board is provided with a circuit pattern formed thereon and a solder bed formed on said circuit pattern, and each of said projections is soldered to said circuit pattern penetrating through the solder bed, and a gap is formed including at least one part between said end face and the circuit pattern, and said gap is not larger than 0.1 millimeter.

3. The shield structure for electronic circuit parts according to claim 1, wherein said circuit board is provided with a circuit pattern formed thereon and a solder bed formed on said circuit pattern, and each of said projections is soldered to said circuit pattern penetrating through the solder bed, and a gap is formed including at least one part between said end face and the circuit pattern, and solder is inserted in at least one part of said gap.

4. The shield structure for electronic circuit parts according to claim 1, wherein the first sidewall of said four sidewalls is provided with the first and the second projections of said three projections, and the second sidewall of said four sidewalls confronting said first sidewall is provided with the third projection of said three projections.

5. The shield structure for electronic circuit parts according to claim 4, wherein, said first, second and third projections are placed so as to fall on each vertex of an isosceles triangle.

6. The shield structure for electronic circuit parts according to claim 4, wherein said first sidewall is provided with an extension extending across said circuit board in the direction of thickness thereof, and said first and second projections are placed on opposite sides of said extension.

7. The shield structure for electronic circuit parts according to claim 4, wherein said second sidewall is provided with two extensions extending across said circuit board in the direction of thickness thereof, and said third projection is placed between each of the extensions.

8. A shield structure for electronic circuit parts comprises a circuit board on which a plurality of electronic circuit parts are disposed, and a shield case which is installed on said circuit board to enclose and shield specific electronic circuit parts among said plurality of electronic circuit parts;

wherein said shield case is provided with a frame member including first and second sidewalls confronting each other, third and fourth sidewalls confronting each other and a cover member covering the farther end of the frame member from said circuit board; said first sidewall is provided with an extension extending across said circuit board in the direction of thickness thereof and two projections, with each one of the two projections being placed on an opposite side of the extension; said second sidewall is provided with two extensions extending across said circuit board in the direction of thickness thereof and a projection placed between said two extensions; and said third and fourth sidewalls are provided with end faces confronting said circuit board, each of said projections protruding to said circuit board for supporting said shield case.

* * * * *